United States Patent [19]
Yamamoto

[11] Patent Number: 5,650,901
[45] Date of Patent: Jul. 22, 1997

[54] CURCUIT BREAKER AND CIRCUIT BREAKING APPARATUS

[75] Inventor: Hiroshi Yamamoto, Tokyo, Japan

[73] Assignee: Mitsubishi Denki Kabushiki Kaisha, Tokyo, Japan

[21] Appl. No.: 589,292

[22] Filed: Jan. 22, 1996

[30] Foreign Application Priority Data

May 12, 1995 [JP] Japan .................... 7-114433

[51] Int. Cl.⁶ .................................... H02H 3/00
[52] U.S. Cl. .................... 361/8; 361/13; 361/58; 361/100
[58] Field of Search .................... 361/3, 8–9, 10, 361/11, 13, 58, 93, 98, 100–101

[56] References Cited

U.S. PATENT DOCUMENTS 4,740,858  4/1988  Yamaguchi et al. .

OTHER PUBLICATIONS

"Design and High–Voltage and Operational testing Of TSR–and TSC–Valves For Static Compensators"; IPEC–Tokyo 1990; pp. 1009–1015.

"12KV 1KA Thyristor"; IPEC–Tokyo 1990; pp. 1201–1206.

"Power Protection 10–106/107"; Transactions of the 10–th National Convention of the Institute of Electrical Engineers of Japan; 1988.

Primary Examiner—Jeffrey A. Gaffin
Assistant Examiner—Michael J. Sherry
Attorney, Agent, or Firm—Leydig, Voit & Mayer

[57] ABSTRACT

A circuit breaker for a distribution system includes a non-self-extinction type semiconductor switch, a current limiting element connected in series to the semiconductor switch for suppressing a fault current. The semiconductor switch and the current limiting element constitute a series circuit. A mechanical type high-speed switch is connected in parallel to the series circuit of the semiconductor switch and the current limiting element. Upon occurrence of a fault in the distribution system, an electric current flowing through the distribution system is commutated to the series circuit from the mechanical type high-speed switch.

13 Claims, 7 Drawing Sheets

CURCUIT BREAKER AND CIRCUIT BREAKING APPARATUS

BACKGROUND OF THE INVENTION

1. Field of the Invention

The present invention generally relates to a circuit breaker and a circuit braking apparatus using the same, both of which are adapted to be employed in a distribution system. More particularly, the present invention is concerned with a circuit breaker and a circuit breaking apparatus equipped with a current limiting function which are advantageously suited for static implementation of a circuit breaker employed for transmitting out an electric power in a power distribution system.

2. Description of Related Art

For better understanding of the present invention, background techniques thereof will first be reviewed in some detail. FIG. 7 is a circuit diagram showing a static type switch for a distribution system which is disclosed in Transactions of the 10-th National Convention of The Institute of Electrical Engineers of Japan: "Power Protection 10-106/107" (1988) and which typifies a known circuit breaker implemented by using thyristors.

Referring to the figure, a main circuit MC is composed of input terminals U1, V1 and W1 which correspond to U-, V- and W-phases of a distribution system, respectively, output terminals U2, V2 and W2 corresponding to the U-, V- and W-phases, respectively, and thyristor switches 1U, 1V and 1W of non-self-extinction type each constituted by a pair of thyristors connected in anti-parallel to each other. Each of the thyristors constituting the non-self-extinction type thyristor switches 1U, 1V and 1W is of such nature that once the thyristor is turned on, it is required for turning off the same to apply a backward voltage between the anode and the cathode thereof or alternatively to lower the forward current below a holding current. For this reason, the thyristor switch constituted by the thyristors mentioned above is referred to as the non-self-extinction type thyristor switch.

Further referring to FIG. 7, one end of the thyristor switch 1U is connected to the input terminal U1 by way of a vacuum electromagnetic contactor 2U while the other end of the thyristor switch 1U is connected to the output terminal U2. Similarly, the thyristor switch 1V has one end connected to the input terminal V1 via a vacuum electromagnetic contactor 2V with the other end of the thyristor switch 1V being connected to the output terminal V2. On the other hand, the thyristor switch 1W has one end connected to the input terminal W1 via a vacuum electromagnetic contactor 2W with the other end being connected to the output terminal W2.

Furthermore, zinc oxide type arresters 3U, 3V and 3W are connected in parallel to the thyristor switches 1U, 1V and 1W, respectively, for the purpose of protecting these switches against a surge voltage. Current transformers 4a and 4b serving as current detecting means are connected between the thyristor switch 1U and the output terminal U2 as well as between the thyristor switch 1W and the output terminal W2 for detecting the conducting currents, respectively. A control unit 5 which operates at a lower potential level than the main circuit MC serves for controlling the opening/closing of the vacuum electromagnetic contactors 2U, 2V and 2W as well as the turn-on/off of the thyristor switches 1U, 1V and 1W on the basis of the detected currents supplied from the current transformers 4a and 4b.

Next, description will turn to the operation of the switch apparatus described above.

When the control unit 5 confirms, on the basis of the detected currents supplied from the current transformers 4a and 4b, that the conducting currents of the thyristor switches 1U and 1W (i.e., currents flowing through the thyristor switches 1U and 1W, respectively, in the conducting states thereof) are zero, the control unit 5 first closes the vacuum electromagnetic contactors 2U, 2V and 2W and then turns on the thyristor switches 1U, 1V and 1W by applying a turn-on signal to the gates thereof in the state in which the vacuum electromagnetic contactors 2U, 2V and 2W are closed. Subsequently, the turn-on signal is cleared from the gates of the thyristor switches 1U, 1V and 1W to thereby allow them to be turned off. Then, the control unit 5 again checks and confirms on the basis of the detected currents supplied from the current transformers 4a and 4b that the conducting currents of the thyristor switches 1U and 1W again assume zero to thereby open the vacuum electromagnetic contactors 2U, 2V and 2W. This operation is what is referred to as the interlock operation which is performed with a view to elongating use life of the vacuum electromagnetic contactor.

Upon occurrence of a fault such as a short circuit event, the circuit breaking operation must of course be performed. In that case, the short-circuit fault is detected by the control unit 5 on the basis of a signal indicating the fault currents (e.g. short-circuit current) as supplied from the current transformers 4a and 4b to thereby remove the turn-on signal from the gate of the thyristor switches within 1 msec., as a result of which the fault current is interrupted by opening or turning off the thyristor switches 1U, 1V and 1W within one cycle (20 msec. at maximum).

With the arrangement of the conventional circuit breaker described above, the fault current such as short-circuit current may flow to the distribution system during a period corresponding to one cycle (e.g. 20 msec.). Consequently, when the short-circuit impedance of the transmission system is lowered due to change or alternation of the transmission system configuration, the value of the fault current increases. To cope with such situation, it is necessary to increase the short-circuit current breaking capacity of the circuit breaker provided at power receiving nodes or locations of power demanding systems or customer's equipment, which in turn means that the power demanding equipment has to be changed or modified correspondingly. Besides, the conventional circuit breaker suffers a problem that loss of the power in the conducting state is large when compared with that of the conventional mechanical type circuit breaker because the power supply is ordinarily performed through the thyristor switches.

SUMMARY OF THE INVENTION

In the light of the state of the art described above, it is an object of the present invention to provide a circuit breaker and a circuit breaking apparatus which can avoid the necessity of increasing the capacity of the customers circuit breakers installed at power receiving nodes in the distribution system even when the fault current (e.g. short-circuit current) increases because of alteration or change of the system configuration.

In view of the above and other objects which will become apparent as the description proceeds, there is provided according to an aspect of the present invention a circuit breaker for a distribution system which comprises a non-self-extinction type semiconductor switch provided in the distribution system, a current limiting element connected in series to the semiconductor switch for suppressing a fault current, the semicondutor switch and the current limiting element constituting a series circuit, and a mechanical type high-speed switch connected in parallel to the series circuit of the semiconductor switch and the current limiting element, wherein upon occurrence of a fault in the distribution system, an electric current flowing through the distribution system is commutated to the series circuit from the mechanical high-speed switch.

According to another aspect of the invention, there is provided a circuit breaker for a single-phase distribution system which includes a non-self-extinction type semiconductor switch provided in the distribution system, a current limiting element connected in series to the semiconductor switch for suppressing a fault current, the semicondutor switch and the current limiting element constituting a series circuit, and a mechanical type high-speed switch connected in parallel to the series circuit of the semiconductor switch and the current limiting element, each of the non-self-extinction type switch, the current limiting element and the mechanical high-speed switch being provided for one phase, wherein upon occurrence of a fault in the distribution system, an electric current flowing through the distribution system is commutated to the series circuit from the mechanical high-speed switch.

According to yet another aspect of the invention, there is provided a circuit breaker for a polyphase distribution system which comprises a non-self-extinction type semiconductor switch provided in the distribution system, a current limiting element connected in series to the semiconductor switch for suppressing a fault current, the semicondutor switch and the current limiting element constituting a series circuit, and a mechanical type high-speed switch connected in parallel to the series circuit of the semiconductor switch and the current limiting element, each of the non-self-extinction type switch, the current limiting element and the mechanical high-speed switch being provided in a number corresponding to that of the phases of the distribution system, wherein upon occurrence of a fault in the distribution system, an electric current flowing through the distribution system is commutated to the series circuit from the mechanical high-speed switch.

According to a still another aspect of the invention, there is provided a circuit breaker for a three-phase distribution system which comprises a non-self-extinction type semiconductor switch provided in the distribution system, a current limiting element connected in series to the semiconductor switch for suppressing a fault current, the semicondutor switch and the current limiting element constituting a series circuit, and a mechanical type high-speed switch connected in parallel to the series circuit of the semiconductor switch and the current limiting element, the non-self-extinction type switch, the current limiting element and the mechanical high-speed switch being provided for two of three phases of the distribution system, wherein upon occurrence of a fault in the distribution system, an electric current flowing through the distribution system is commutated to the series circuit from the mechanical high-speed switch.

According to a further aspect of the invention, there is provided a circuit breaking apparatus for a distribution system, which apparatus comprises a circuit breaker including a non-self-extinction type semiconductor switch provided in the distribution system, a current limiting element connected in series to the semiconductor switch for suppressing a fault current, the semicondutor switch and the current limiting element constituting a series circuit, and a mechanical type high-speed switch connected in parallel to the series circuit of the semiconductor switch and the current limiting element, wherein upon occurrence of a fault in the distribution system, an electric current flowing through the distribution system is commutated to the series circuit from the mechanical high-speed switch, a detecting means for detecting a current flowing through the distribution system, and a control means for controlling the semiconductor switch and the high-speed switch of the circuit breaker on the basis of detection output of the detecting means.

According to a still further aspect of the invention, there is provided a circuit breaking apparatus for a single-phase distribution system, which apparatus comprises a circuit breaker including a non-self-extinction type semiconductor switch provided in the distribution system, a current limiting element connected in series to the semiconductor switch for suppressing a fault current, the semicondutor switch and the current limiting element constituting a series circuit, and a mechanical type high-speed switch connected in parallel to the series circuit of the semiconductor switch and the current limiting element, each of the non-self-extinction type switch, the current limiting element and the mechanical high-speed switch being provided for one phase, wherein upon occurrence of a fault in the distribution system, an electric current flowing through the distribution system is commutated to the series circuit from the mechanical high-speed switch, a detecting means for detecting a current flowing through the distribution system, and a control means for controlling the semiconductor switch and the high-speed switch of the circuit breaker on the basis of detection output of the detecting means.

According to yet another aspect of the invention, there is provided a circuit breaking apparatus for a polyphase distribution system, which apparatus comprises a circuit breaker including a non-self-extinction type semiconductor switch provided in the distribution system, a current limiting element connected in series to the semiconductor switch for suppressing a fault current, the semicondutor switch and the current limiting element constituting a series circuit, and a mechanical type high-speed switch connected in parallel to the series circuit of the semiconductor switch and the current limiting element, each of the non-self-extinction type switch, the current limiting element and the mechanical high-speed switch being provided in a number corresponding to that of the phases of the distribution system, wherein upon occurrence of a fault in the distribution system, an electric current flowing through the distribution system is commutated to the series circuit from the mechanical high-speed switch, a detecting means for detecting a current flowing through the distribution system, and a control means for controlling the semiconductor switch and the high-speed switch of the circuit breaker on the basis of detection output of the detecting means.

According to still another aspect of the invention a circuit breaking apparatus for a three-phase distribution system, which apparatus comprises a circuit breaker including a non-self-extinction type semiconductor switch provided in the distribution system, a current limiting element connected in series to the semiconductor switch for suppressing a fault current, the semicondutor switch and the current limiting element constituting a series circuit, and a mechanical type high-speed switch connected in parallel to the series circuit of the semiconductor switch and the current limiting element, the non-self-extinction type switch, the current limiting element and the mechanical high-speed switch being provided for two of three phases of the distribution system, wherein upon occurrence of a fault in the distribution system, an electric current flowing through the distribution system is commutated to the series circuit from the mechanical high-speed switch, a detecting means for detecting a current flowing through the distribution system, and a control means for controlling the semiconductor switch and the high-speed switch of the circuit breaker on the basis of detection output of the detecting means.

With the structures of the circuit breakers and the circuit breaking apparatuses described above, the current flowing through the distribution system is commutated to the series circuit comprised of the non-self-extinction type semiconductor switch and the current limiting element from the mechanical high-speed switch upon occurrence of a fault in the distribution system, whereby the fault current is limited by the current limiting element while the semiconductor switch is turned off after lapse of a predetermined time. Thus, the fault current undergoes limitation and then interruption substantially within one cycle after occurrence of the fault. Thus, even if a short-circuit impedance of the distribution system is lowered due to some change in the system configuration, the fault current can be prevented from increasing, which in turn means that there is no necessity of increasing the short-circuit breaking capacity of those circuit breakers which are installed at power receiving nodes for power demanding equipment. To say in another way, the distribution system configuration can be changed or modified without need for corresponding change or modification of the power demanding systems or equipment connected to the distribution system.

In a preferred mode for carrying out the invention, the current limiting element may include a current limiting reactor.

By using the current limiting reactor as the current limiting element, the current limiting function for the fault current (e.g. short-circuit) can be achieved.

In another preferred mode for carrying out the invention, the current limiting element may include a saturable reactor.

By using the saturable reactor as the current limiting element, fault current limiting function as desired can be achieved.

In yet another preferred mode for carrying out the invention, the current limiting element may include a current limiting fuse.

By using the fuse as the current limiting element, not only the fault current limiting function but also the fault current interrupting function can inexpensively be realized with high reliability.

In still another preferred mode for carrying out the invention, the current limiting element may be include a current limiting resistor.

By using the current limiting reactor as the current limiting element, there can be achieved the desired fault current limiting function with an inexpensive structure.

In a further preferred mode for carrying out the invention, the semiconductor switch may include a pair of thyristors connected in anti-parallel with each other.

By virtue of implementation of the non-self-extinction type semiconductor switch by a pair of thyristors connected in anti-parallel to each other, the fault current can be interrupted with enhanced reliability.

In a still further preferred mode for carrying out the invention, the mechanical high-speed switch may include an electromagnetic trip mechanism.

By employing the mechanical high-speed switch which is equipped with the electromagnetic trip mechanism, the fault current can be interrupted without fail within the range of the current breaking capacity of the circuit breakers installed at the power receiving nodes for the power demanding equipment connected to the distribution system. Besides, upon closing of the circuit breaker, the steady current can flow through the high-speed switch. Thus, the power loss which may otherwise occur can be suppressed substantially to zero.

The above and other objects, features and attendant advantages of the present invention will more easily be understood by reading the following description of the preferred embodiments thereof taken, only by way of example, in conjunction with the accompanying drawings.

BRIEF DESCRIPTION OF THE DRAWINGS

In the course of the description which follows, reference is made to the drawings, in which.

DESCRIPTION OF THE PREFERRED EMBODIMENTS

Figure 1:
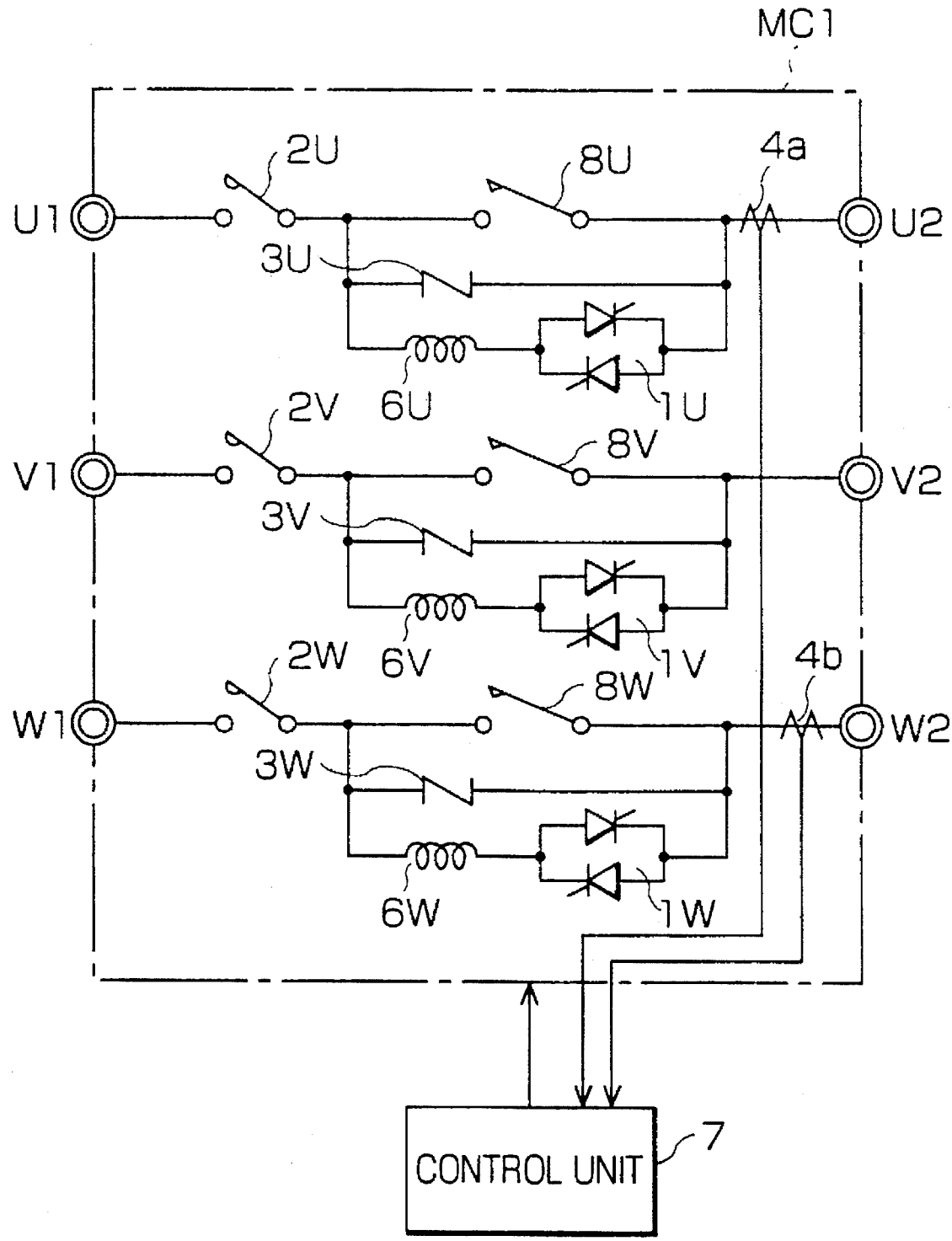
FIG. 1 is a circuit diagram showing a structure of a circuit breaker according to a first embodiment of the present invention.

Now, the present invention will be described in detail in conjunction with what is presently considered as preferred or typical embodiments thereof by reference to the drawings. In the following description, like reference characters designate like or corresponding parts throughout the several views.

Embodiment 1

FIG. 1 is a circuit diagram showing a structure of a circuit breaker according to a first embodiment of the present invention. Referring to the figure, a main circuit MC1 is composed of input terminals U1, V1 and W1 which correspond to U-, V- and W-phases, respectively, output terminals U2, V2 and W2 corresponding to the U-, V- and W-phases, respectively, and thyristor switches 1U, 1V and 1W of non-self-extinction type which are implemented as semiconductor switches and each of which is constituted by a pair of thyristors connected in anti-parallel to each other. Each of the thyristors constituting each of the non-self-extinction type thyristor switches 1U, 1V and 1W is of such nature that once the thyristor is turned on, it is required for turning off (or resetting to the off-state) the same to apply a backward voltage between the anode and the cathode thereof or alternatively to lower the forward current below a level of the holding current. Accordingly, the thyristor switch constituted by these thyristors is referred to as the non-self-extinction type thyristor switch, as mentioned previously.

Further referring to FIG. 1, one end of the thyristor switch 1U is connected to the input terminal U1 by way of a vacuum electromagnetic contactor 2U and a current limiting reactor 6U which will be described hereinafter, while the other end of the thyristor switch 1U is connected to the output terminal U2. Similarly, the thyristor switch 1V has one end connected to the input terminal V1 via a vacuum electromagnetic contactor 2V and a current limiting reactor 6V described later on with the other end of the thyristor switch 1V being connected to the output terminal V2. Finally, the thyristor switch 1W has one end connected to the input terminal W1 via a vacuum electromagnetic contactor 2W and a current limiting reactor 6W also described hereinafter with the other end of the thyristor switch 1W being connected to the output terminal W2.

The current limiting reactors 6U, 6V and 6W are connected in series to the thyristor switches 1U, 1V and 1W, respectively, wherein each of the current limiting reactors 6U, 6V and 6W may be constituted, for example, by an air-core reactor imparted with a current limiting function or capability. Further, as can be seen in FIG. 1, high-speed switches 8U, 8V and 8W are connected in parallel to the series circuits of the current limiting reactors 6U, 6V and 6W and the thyristor switches 1U, 1V and 1W, respectively. Each of the high-speed switches 8U, 8V and 8W may be constituted by a mechanical type high-speed switch composed of a vacuum valve equipped with an electromagnetic repulsion type trip mechanism. The high-speed switch is so designed as to interrupt or break the fault current (e.g. short-circuit) at least within a time corresponding to ⅛ cycle so that the fault current can be broken within a range of current breaking capacity of the circuit breaker installed at the side of the power demanding or consuming equipment. It is sufficient for the high-speed switch to have a current breaking capacity equivalent to a half or less of the fault current.

Furthermore, zinc oxide type attesters 3U, 3V and 3W are connected in parallel to the series circuits of the thyristor switches 1U, 1V and 1W and the current limiting reactor 6U, 6V and 6W, respectively, for the purpose of ensuring the protection of these switches against abnormally high or surge voltage. Additionally, a current transformer 4a serving as a first current detecting means is disposed between the parallel connection of the thyristor switch 1U and the high-speed switch 8U and the output terminal U2 for detecting the conducting current of the thyristor switch 1U and the high-speed switch 8U, while a second current transformer 4b serving as a second current detecting means is disposed between the parallel circuit of the thyristor switch 1W and the high-speed switch 8W and the output terminal W2 for detecting the conducting currents flowing through the thyristor switch 1W and the high-speed switch 8W.

A control unit 7 which operates at a lower potential level than the main circuit MC1 serves for controlling the opening/closing of the vacuum electromagnetic contactors 2U, 2V and 2W as well as turn-on/off of the thyristor switches 1U, 1V and 1W and high-speed switches 8U, 8V and 8W on the basis of the detected currents outputted from the current transformers 4a and 4b, respectively.

Next, operation of the circuit breaker according to the instant embodiment of the invention will be described.

First, description will turn to the normal operation in the state in which no fault current (e.g. short-circuit current) is detected. When the control unit 7 confirms on the basis of the detected currents supplied from the current transformers 4a and 4b that the conducting currents of the thyristor switches 1U and 1W and the high-speed switches 8U and 8W, (i.e., currents flowing through the thyristor switches 1U and 1W and high-speed switches 8U and 8W, respectively, in the conducting states thereof) are zero, the control unit 7 closes the vacuum electromagnetic contactors 2U, 2V and 2W and then closes the high-speed switches 8U, 8V and 8W in the state where the vacuum electromagnetic contactors 2U, 2V and 2W have been closed.

When the control unit 7 confirms on the basis of the detected currents supplied from the current transformers 4a and 4b that the high-speed switch 8U, 8V and 8W are closed, the control unit 7 applies a turn-on signal to the gates of the thyristor switches 1U, 1V and 1W, respectively, to thereby turn on the thyristor switches 1U, 1V and 1W. However, because the current limiting reactors 6U, 6V and 6W are inserted in series to the thyristor switches 1U, 1V and 1W, the currents will flow through the high-speed switches 8U, 8V and 8W each having an essentially low impedance, even when the thyristor switches 1U, 1V and 1W are turned on.

Further, at the same time as the high-speed switches 8U, 8V and 8W are turned off, the turn-on signal is cleared from the gates of the thyristor switches 1U, 1V and 1W to thereby allow them to be turned off. Then, the control unit 7 again checks and confirms on the basis of the detected currents supplied from the current transformers 4a and 4b that the conducting currents of the thyristor switches 1U and 1W have become zero, to thereby open the vacuum electromagnetic contactors 2U, 2V and 2W. In this manner, the interlock operation described hereinbefore in conjunction with the conventional circuit breaker is realized for the purpose of extending the use life of the contactors.

Figure 2:
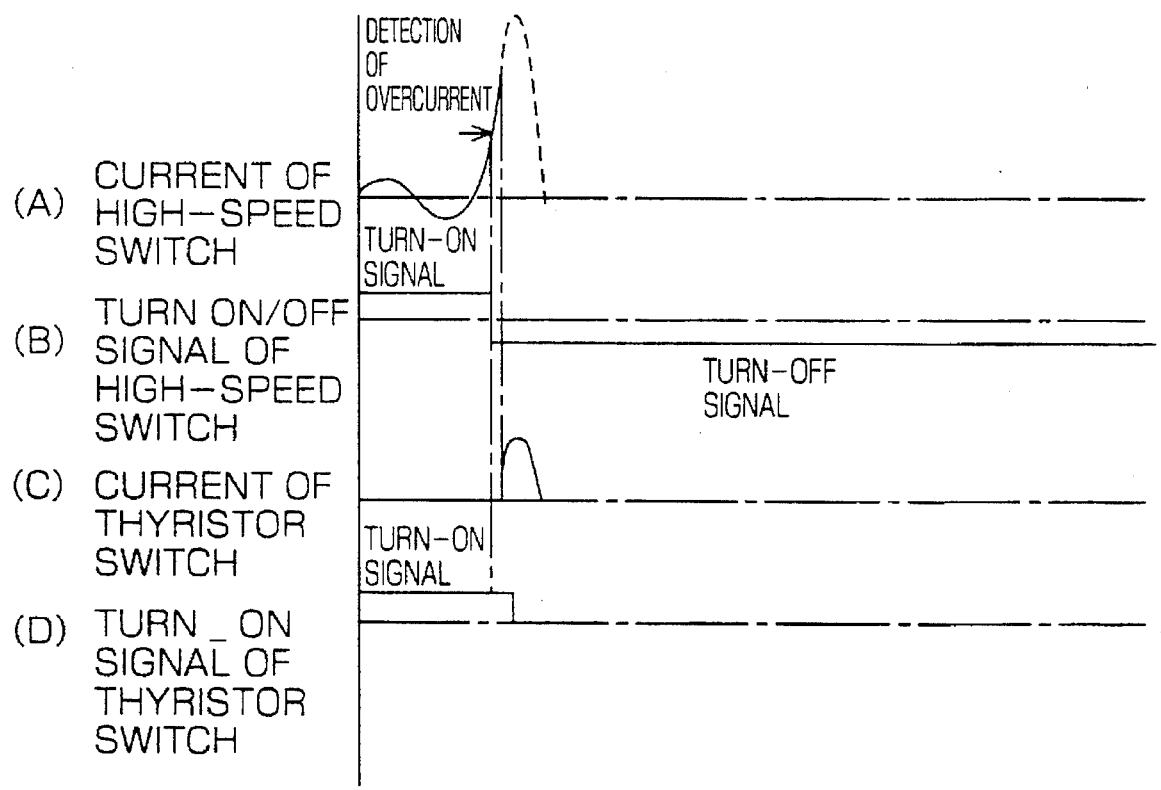
FIG. 2 is a view for graphically illustrating operation of the circuit breaker according to the first embodiment of the invention.

Next, referring to FIG. 2, description will be directed to operation of the circuit breaker of the structure described above for interrupting or breaking a fault current such as a short-circuit current.

As described hereinbefore, the control unit 7 supplies the turn-on signal to the gates of the thyristor switches 1U, 1V and 1W after the vacuum electromagnetic contactors 2U, 2V and 2W have been closed with the high-speed switches 8U, 8V and 8W having been closed. Then, when an overcurrent representative of the fault current (see FIG. 2 at (A)) is detected by the current transformers 4a and 4b, the turn-off signal is supplied to the electromagnetic repulsion type trip devices of the high-speed switches 8U, 8V and 8W within a period in which the fault current can not exceed the range of the current breaking capacity of the circuit breaker installed at the power receiving nodes for the power demanding equipment or loads for short, as is illustrated in FIG. 2 at (B). Hence, the high-speed switches 8U, 8V and 8W are opened to allow the fault current to be commutated to the thyristor switches 1U, 1V and 1W.

In this state, the fault currents flowing through the thyristor switches 1U, 1V and 1W are limited by the current limiting reactors 6U, 6V and 6W connected in series to the thyristor switches 1U, 1V and 1W, respectively, as illustrated in FIG. 2 at (C), while the turn-on signal applied to the gates of the thyristor switches 1U, 1V and 1W is cleared with a time lag of a predetermined time which is required for opening the high-speed switch in response to the turn-off signal for the high-speed switches 8U, 8V and 8W. See in FIG. 2 at (D). Thus, the fault current as limited is interrupted substantially within one cycle after the occurrence of the fault current. The operations described above will be self-explanatory from FIG. 2.

As will now be understood from the foregoing description, the fault current such as short-circuit current undergoes limitation and interruption substantially within one cycle after occurrence of a fault. Thus, even when the short-circuit impedance of the power transmission is lowered due to change of the power transmission system configuration, the fault current is prevented from increasing, which means that there is no necessity of increasing the short-circuit current breaking capacity of the circuit breaker disposed at the power receiving locations for the loads and thus the system change or alteration can be realized without need for changing the circuit breaker for the power consuming equipment or loads. Additionally, because the steady current can flow through the high-speed switch while bypassing the semiconductor switch, power loss in the conducting state can significantly be decreased.

Embodiment 2

Figure 3:
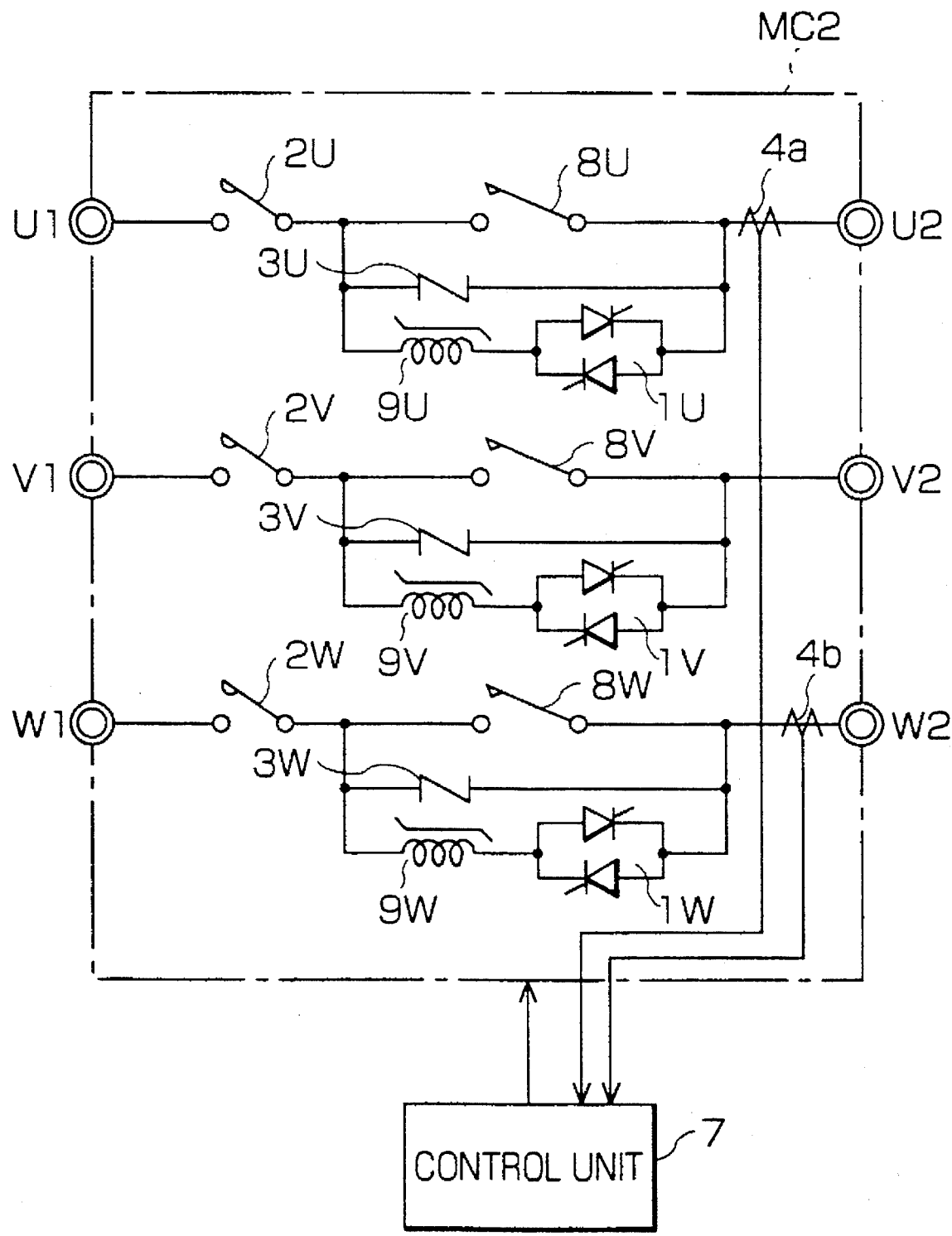
FIG. 3 is a circuit diagram showing a structure of the circuit breaker according to a second embodiment of the invention.

FIG. 3 shows a circuit diagram of a circuit breaker according to a second embodiment of the present invention. In FIG. 3, parts equivalent to those shown in FIG. 1 are designated by like reference characters, and repeated description thereof is omitted. Referring to FIG. 3, a main circuit MC2 includes thyristor switches 1U, 1V and 1W, wherein saturable reactors 9U, 9V and 9W each having a current limiting function and serving as current limiting elements are connected in series to the thyristor switches 1U, 1V and 1W, respectively. With regards to the other arrangement, the circuit breaker according to the instant embodiment of the invention is essentially identical with that of the circuit breaker shown in FIG. 1. Accordingly, the circuit beaker according to the instant embodiment of the invention differs from that of the first embodiment in that the saturable reactors 9U, 9V and 9W are employed in place of the current limiting reactors 6U, 6V and 6W of the circuit breaker shown in FIG. 1, wherein the saturable reactors 9U, 9V and 9W serve for limiting the fault current in the unsaturated state only during the period in which the thyristor switches 1U, 1V and 1W are conducting.

As will be understood from the above description, with the structure of the circuit breaker according to the instant embodiment of the invention, not only the current limiting function described hereinbefore in conjunction with the circuit breaker according to the first embodiment of the invention can be realized but also the circuit breaker can be implemented in a smaller package size because a number of coils can be decreased owing to the use of the saturable reactor incorporating a core as the current limiting element.

Embodiment 3

Figure 4:
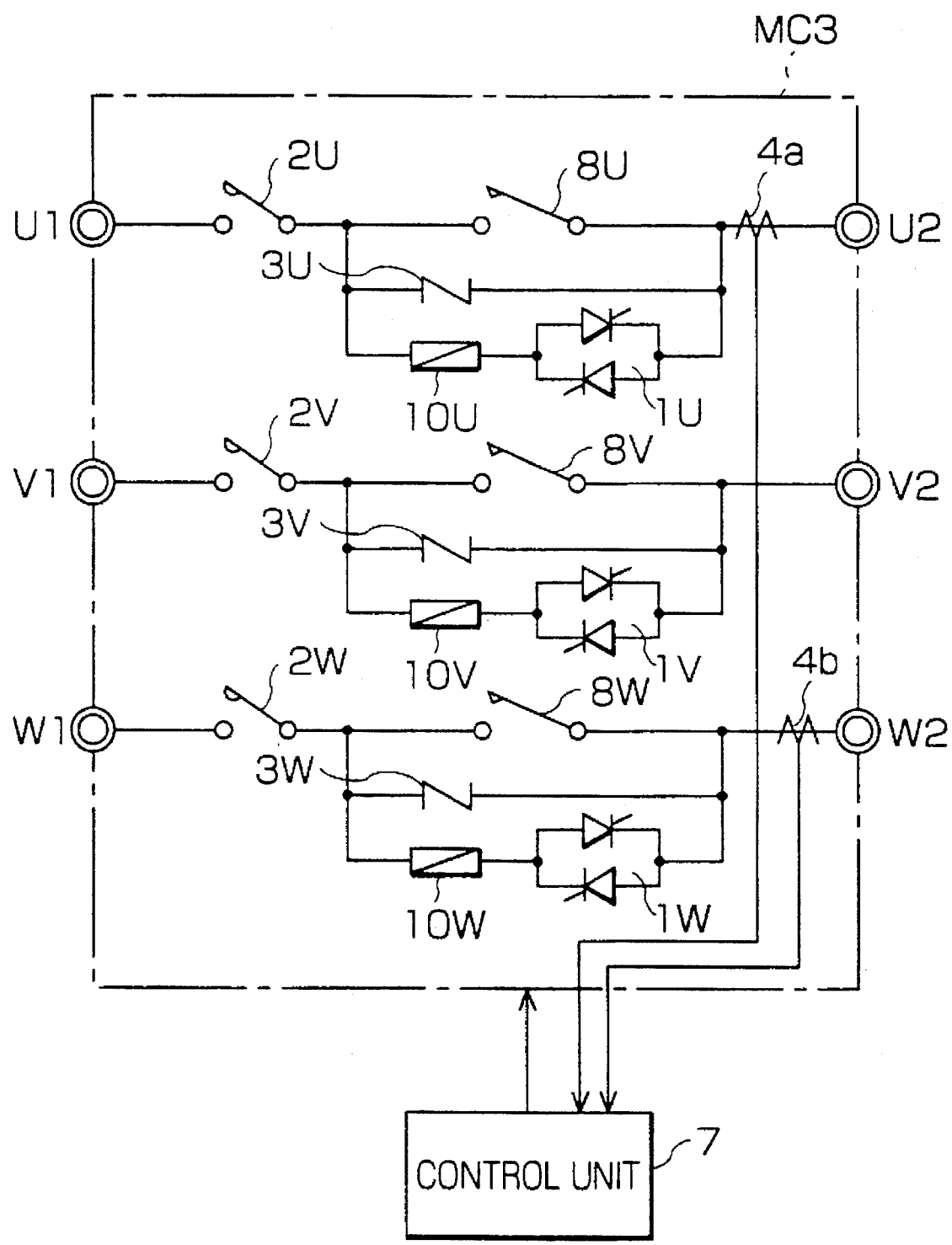
FIG. 4 is a circuit diagram showing a structure of the circuit breaker according to a third embodiment of the invention.

FIG. 4 shows a circuit diagram of a circuit breaker according to a third embodiment of the present invention. In FIG. 4, parts equivalent to those shown in FIG. 1 are designated by like reference characters. Repeated description thereof will thus be unnecessary. Referring to FIG. 4, a main circuit MC3 includes current limiting fuses 10U, 10V and 10W which are connected in series to the thyristor switches 1U, 1V and 1W, respectively, and each of which has a current limiting function as well as a current interrupting function. With regards to the other arrangement, the circuit breaker according to the instant embodiment of the invention is essentially identical with that of the circuit breaker shown in FIG. 1. That is, in the case of the circuit beaker according to the instant embodiment of the invention, the current limiting fuses 10U, 10V and 10W are employed in place of the current limiting reactors 6U, 6V and 6W of the circuit breaker shown in FIG. 1, wherein the current limiting fuses 10U, 10V and 10W serve for not only limiting the fault current but also interrupting the fault current by fusing in the event the thyristor switches 1U, 1V and 1W should fail to interrupt the fault current.

As will be understood from the above description, with the structure of the circuit breaker according to the instant embodiment of the invention, not only the current limiting function as described hereinbefore in conjunction with the circuit breaker according to the first embodiment of the invention can be realized but also the fault current can be interrupted by the fuses in the event the thyristor switches 1U, 1V and 1W should fail to interrupt such fault current. This is because the fuses are employed as described above. Thus, the reliability of operation of the circuit breaker can significantly be improved.

Embodiment 4

Figure 5:
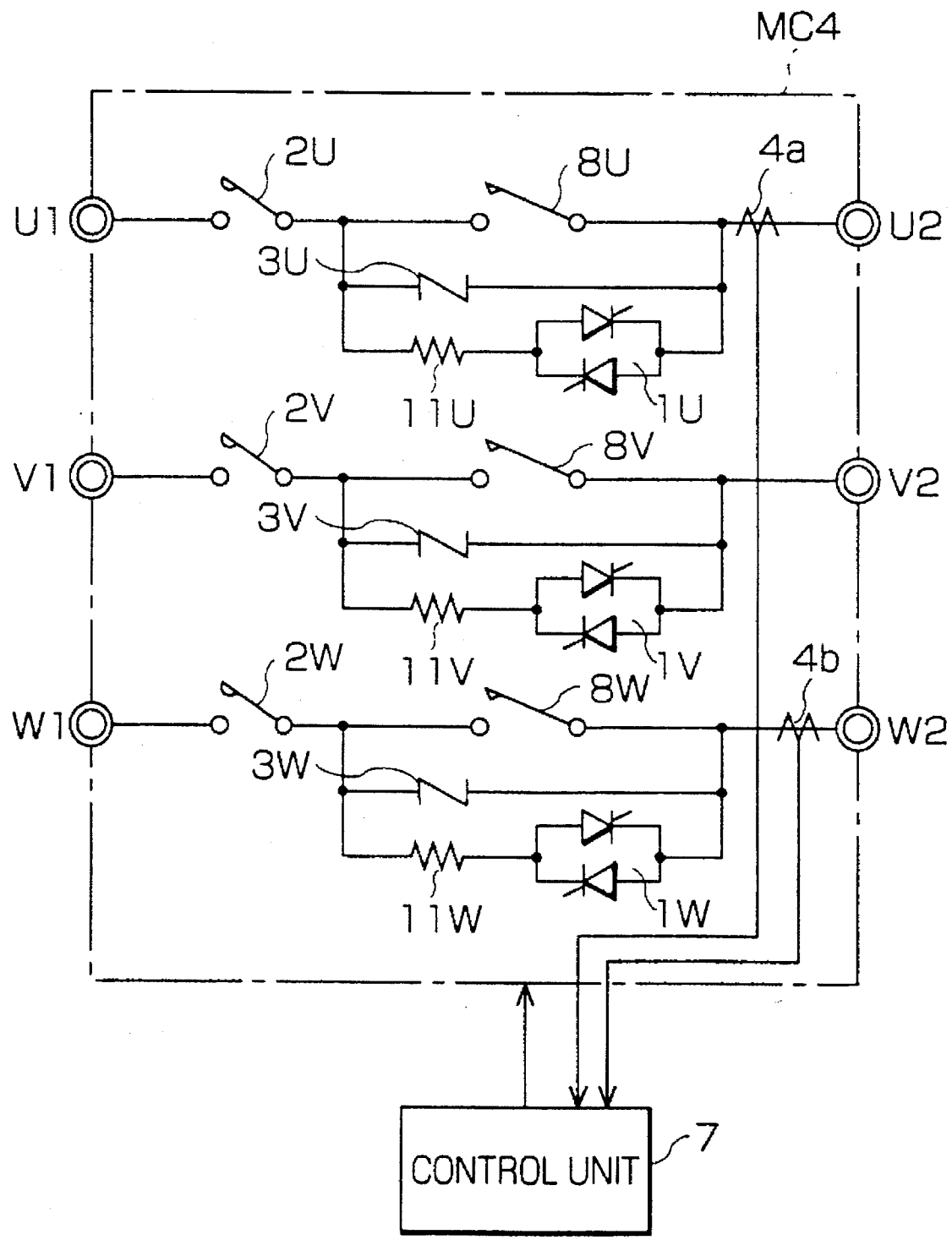
FIG. 5 is a circuit diagram showing a structure of the circuit breaker according to a fourth embodiment of the invention.

FIG. 5 shows a circuit diagram showing a structure of the circuit breaker according to a fourth embodiment of the present invention. In FIG. 5, parts equivalent to those shown in FIG. 1 are designated by like reference characters, and repeated description thereof is omitted. Referring to FIG. 5, a main circuit MC4 includes current limiting resistors 11U, 11V and 11W each having a current limiting function and serving as the current limiting element. These current limiting resistors 11U, 11V and 11W are connected in series to the thyristor switches 1U, 1V and 1W, respectively. In respect to the other arrangement, the circuit breaker according to the instant embodiment is substantially the same as that of the circuit configuration shown in FIG. 1. More specifically, the circuit beaker according to the instant embodiment of the invention differs from the first embodiment in that the current limiting resistors 11U, 11V and 11W are employed in place of the current limiting reactors 6U, 6V and 6W, wherein the current limiting resistors 11U, 11V and 11W serve for limiting the fault current. The circuit breaker according to the instant embodiment of the invention is advantageous in that the circuit breaker can be manufactured at low cost.

As will be understood from the above description, with the structure of the circuit breaker according to the instant embodiment of the invention, not only the current limiting function described previously in conjunction with the first embodiment of the invention can be realized but also the circuit breaker can be manufactured at low cost. This is because the current limiting resistors 11U, 11V and 11W which are inherently inexpensive elements are employed as the current limiting means.

Embodiment 5

Figure 6:
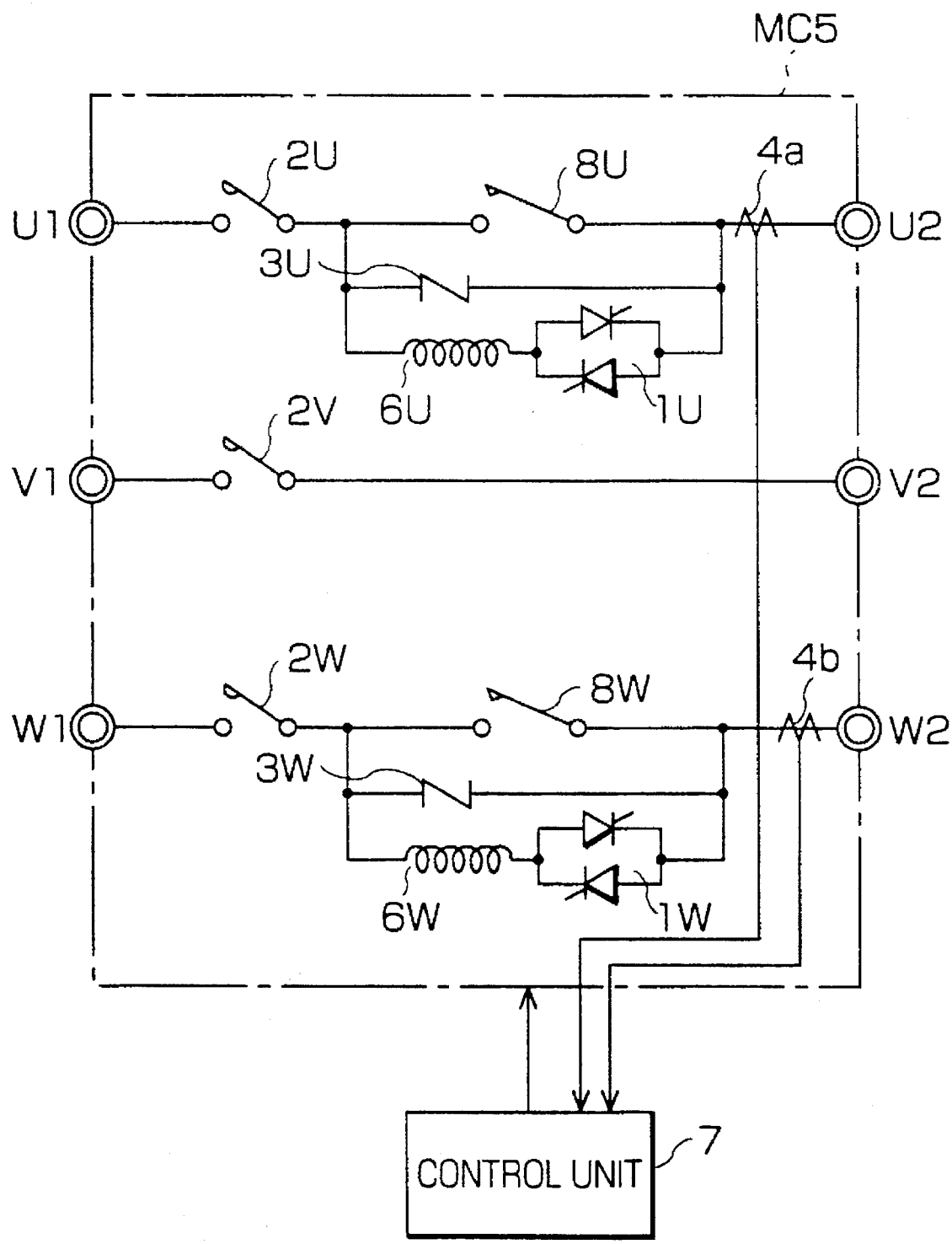
FIG. 6 is a circuit diagram showing a structure of the circuit breaker according to a fifth embodiment of the invention.
Figure 7:
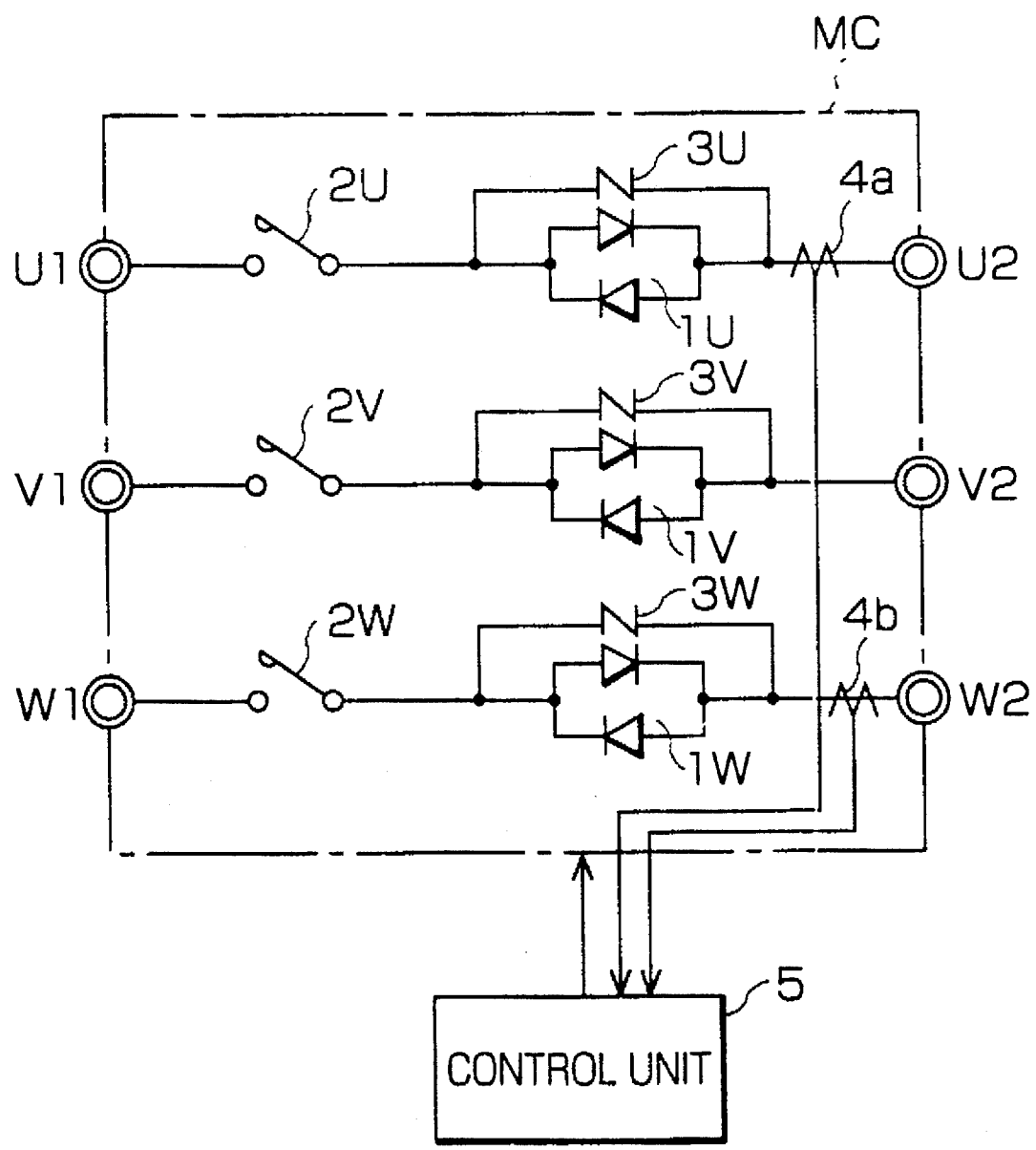
FIG. 7 is a circuit diagram showing a configuration of a conventional circuit breaker.

FIG. 6 is a circuit diagram showing a structure of the circuit breaker according to a fifth embodiment of the invention. In FIG. 6, parts equivalent to those mentioned hereinbefore by reference to FIG. 1 are designated by like reference characters. Accordingly, repeated description thereof will be unnecessary. Referring to FIG. 6, a main circuit MC5 according to the instant embodiment of the invention differs from those of the preceding embodiments in that the relevant components are provided only for two phases, e.g. U- and W-phases while in the case of the preceding embodiments such components are provided for all of the three phases, respectively.

More specifically, referring to FIG. 6, there are provided between the input terminal U1 and the output terminal U2 for the U-phase the thyristor switch 1U, the vacuum electromagnetic contactor 2U, the zinc oxide type arrester 3U, the current limiting reactor 6U, the high-speed switch 8U and the current transformer 4a, while disposed between the input terminal W1 and the output terminal W2 for the W-phase are the thyristor switch 1W, the vacuum electromagnetic contactor 2W, the zinc oxide type arrester 3W, the current limiting reactor 6W, the high-speed switch 8W and the current transformer 4b. By contrast, for the U-phase, only the vacuum electromagnetic contactor 2V is provided while the other components such as the vacuum electromagnetic contactor 2V, zinc oxide type attester 3V, the current limiting reactor 6V and the high-speed switch 8V are all spared.

In the case of the circuit breaker according to the instant embodiment of the invention, the rated voltages of the thyristor switch 1U, the zinc oxide type arrester 3U, the current limiting reactor 6U and the high-speed switch 8U as well as the thyristor switch 1W, the zinc oxide type arrester 3W, the current limiting reactor 6W and the high-speed switch 8W, respectively, are higher by a factor of √3 when compared with the corresponding components employed in the circuit breakers described hereinbefore because the line voltage is applied when the thyristor switch 1U and the high-speed switch 8U as well as the thyristor switch 1W and the high-speed witch 8W are turned off. However, the circuit breaker according to the instant embodiment can enjoy such advantages as the simplified structure, inexpensiveness and implementation in a small size.

As will be appreciated from the foregoing, the circuit breaker according to the instant embodiment of the invention can achieve the current limiting function as with the case of the preceding embodiments. Additionally, because the constituents of the main circuit MC for one phase can be spared, it is possible to implement the circuit breaker inexpensively in a miniaturized structure.

Many features and advantages of the present invention are apparent form the detailed description and thus it is intended by the appended claims to cover all such features and advantages of the system which fall within the true spirit and scope of the invention. Further, since numerous modifications and combinations will readily occur to those skilled in the art, it is not intended to limit the invention to the exact construction and operation illustrated and described.

By way of example, although the invention has been described on the assumption that the distribution system is three phases, the invention can equally find applications to polyphase distribution systems, in general, as well as distribution systems of a single phase. Furthermore, although it has been assumed that the electromagnetic repulsion trip type vacuum valve is employed as the mechanical high-speed switch, there can be employed other mechanical type high-speed switch such as an electromagnetic induction trip type vacuum valve and the like.

Accordingly, all suitable modifications and equivalents may be resorted to, falling within the spirit and scope of the invention.

What is claimed is:

1. A circuit breaker for a distribution system, comprising:
   a non-self-extinction type semiconductor switch;
   a current limiting element connected in series to said semiconductor switch for suppressing a fault current, said semiconductor switch and said current limiting element constituting a series circuit;
   a mechanical type high-speed switch connected in parallel to the series circuit of said semiconductor switch and said current limiting element; and
   a control circuit coupled to said non-self-extinction type semiconductor switch and to said mechanical type high-speed switch to open said mechanical type high-speed switch while maintaining said non-self extinction type switch closed upon occurrence of a fault current in the distribution system, to commutate the fault current from said mechanical high-speed switch to the series circuit, and to open said non-self-extinction type semiconductor switch a preselected period of time after opening said mechanical type high-speed switch, the preselected amount of time being an amount of time required to open said mechanical type high-speed switch.

2. A circuit breaker according to claim 1, wherein each of said semicondutor switch, said current limiting element and said mechanical high-speed switch is provided for one phase.

3. A circuit breaker according to claim 1, wherein each of said semicondutor switch, said current limiting element and said mechanical high-speed switch is provided in a number corresponding to that of the phase said distribution system.

4. A circuit breaker according to claim 1, wherein each of said semicondutor switch, said current limiting element and said mechanical high-speed switch is provided for two of three phases of said distribution system.

5. A circuit breaker according to claim 1, wherein said current limiting element includes a current limiting reactor.

6. A circuit breaker according to claim 1, wherein said current limiting element includes a saturable reactor.

7. A circuit breaker according to claim 1, wherein said current limiting element includes a current limiting fuse.

8. A circuit breaker according to claim 1, wherein said current limiting element includes a current limiting resistor.

9. A circuit breaker according to claim 1, wherein said semiconductor switch includes a pair of thyristors connected in anti-parallel with each other.

10. A circuit breaking apparatus for a distribution system, comprising:
    a circuit breaker including a non-self-extinction type semiconductor switch provided in said distribution system, a current limiting element connected in series to said semiconductor switch for suppressing a fault current, said semiconductor switch and said current limiting element constituting a series circuit, and a mechanical type high-speed switch connected in parallel to the series circuit of said semiconductor switch and said current limiting element, wherein upon occurrence of a fault in the distribution system, an electric current flowing through said distribution system is commutated to said series circuit from said mechanical high-speed switch;
    detecting means for detecting a fault current flowing through said distribution system; and
    control means for controlling said semiconductor switch and said mechanical high-speed switch of said circuit breaker on the basis of detection output of said detecting means such that said mechanical high-speed switch is opened when the fault current is detected and said semiconductor switch is opened a short time after said mechanical high-speed switch is opened.

11. A circuit breaking apparatus according to claim 10, wherein each of said semicondutor switch, said current limiting element and said mechanical high-speed switch is provided for one phase.

12. A circuit breaking apparatus according to claim 10, wherein each of said semicondutor switch, said current limiting element and said mechanical high-speed switch is provided in a number corresponding to that of the phase of said distribution system.

13. A circuit breaking apparatus according to claim 10, wherein each of said semicondutor switch, said current limiting element and said mechanical high-speed switch is provided for two of three phases of the distribution system.

\* \* \* \* \*

UNITED STATES PATENT AND TRADEMARK OFFICE
CERTIFICATE OF CORRECTION

PATENT NO. : 5,650,901
DATED : July 22, 1997
INVENTOR(S) : Yamamoto

It is certified that error appears in the above-indentified patent and that said Letters Patent is hereby corrected as shown below:

Column 12, Line 8, after "phase" insert --of--.

Signed and Sealed this

Sixteenth Day of December, 1997

Attest:

BRUCE LEHMAN

Attesting Officer

Commissioner of Patents and Trademarks